(12) United States Patent
Fischer

(10) Patent No.: US 8,970,224 B2
(45) Date of Patent: Mar. 3, 2015

(54) CIRCUIT BREAKER AND METHOD FOR CHECKING A ROGOWSKI CONVERTER IN A CIRCUIT BREAKER

(75) Inventor: Andreas Fischer, Amberg (DE)

(73) Assignee: Siemens Aktiengesellschaft, Munich (DE)

( * ) Notice: Subject to any disclaimer, the term of this patent is extended or adjusted under 35 U.S.C. 154(b) by 220 days.

(21) Appl. No.: 13/604,169

(22) Filed: Sep. 5, 2012

(65) Prior Publication Data

US 2013/0057307 A1 Mar. 7, 2013

(30) Foreign Application Priority Data

Sep. 6, 2011 (DE) .......................... 10 2011 082 172

(51) Int. Cl.
*H02H 3/02* (2006.01)
*H01H 83/04* (2006.01)
*G01R 31/327* (2006.01)
*G01R 31/06* (2006.01)
*G01R 15/18* (2006.01)
*G01R 35/00* (2006.01)

(52) U.S. Cl.
CPC .............. *H01H 83/04* (2013.01); *H02H 3/02* (2013.01); *G01R 31/3277* (2013.01); *G01R 31/06* (2013.01); *G01R 15/181* (2013.01); *G01R 35/00* (2013.01)
USPC ........... 324/546; 324/750.3; 361/115; 361/65

(58) Field of Classification Search
CPC .. G01R 15/181; G01R 31/3278; G01R 31/06; G01R 35/04; G01R 35/06; H01H 83/04

USPC ................... 324/750.3, 537, 555, 546; 361/65
See application file for complete search history.

(56) References Cited

U.S. PATENT DOCUMENTS

| 3,659,197 | A | * | 4/1972 | Alley et al. ................. 324/546 |
| 7,843,778 | B2 | * | 11/2010 | Yasuda et al. .............. 369/44.32 |
| 7,923,701 | B2 | * | 4/2011 | Inada et al. ................ 250/440.11 |
| 2009/0242794 | A1 | | 10/2009 | Inada et al. |
| 2012/0075043 | A1 | * | 3/2012 | Kopaczewski ................. 335/18 |

FOREIGN PATENT DOCUMENTS

| CN | 1786724 A | 6/2006 |
| DE | 198 25 383 A1 | 12/1999 |
| DE | WO9962157 A1 * | 12/1999 ............... H02H 1/00 |
| JP | 2003090851 A | 3/2003 |

OTHER PUBLICATIONS

German Office Action for German Application No. DE 10 2011 082 172.4 dated Mar. 21, 2012.
Priority Document German Application No. DE 10 2011 082 172.4 filed Sep. 6, 2011.
Office Action for corresponding Chinese patent application No. 2012104618131 dated Jul. 2, 2014 with English translation.

\* cited by examiner

*Primary Examiner* — Arleen M Vazquez
*Assistant Examiner* — Robert P Alejnikov, Jr.
(74) *Attorney, Agent, or Firm* — Harness, Dickey & Pierce, P.L.C.

(57) ABSTRACT

A circuit breaker is disclosed. A Rogowski converter is checked for wire breakage by applying a voltage to the Rogowski converter which is output by a digital/analog converter in response to a digital signal. The digital signal is dependent on the switch rated current of the circuit breaker.

5 Claims, 2 Drawing Sheets

CIRCUIT BREAKER AND METHOD FOR CHECKING A ROGOWSKI CONVERTER IN A CIRCUIT BREAKER

PRIORITY STATEMENT

The present application hereby claims priority under 35 U.S.C. §119 to German patent application number DE 10 2011 082 172.4 filed Sep. 6, 2011, the entire contents of which are hereby incorporated herein by reference.

FIELD

At least one embodiment of the invention relates to a circuit breaker. At least one embodiment also relates to a method for checking a Rogowski converter in a circuit breaker.

Such a circuit breaker is currently available on the market under the name "NSX" from the Schneider company.

BACKGROUND

In order for it to be able to interrupt a conductive connection, a circuit breaker has at least one switching contact. The conductive connection is intended to be interrupted when the current level of a current through a power line exceeds a particular value. This requires the current level to be measured. In the present case, a Rogowski converter is used to measure the current level; this is a coil without an iron core, i.e. an air-core inductor or generally a coil wound on a plastic body. The Rogowski converter has an amplification stage arranged downstream of it for amplifying output signals from the Rogowski converter, that is to say for amplifying the voltage induced in the Rogowski converter on account of a change in the current level through the power line. There is also a data processing device—typically a microcontroller—for evaluating the thus amplified output signals and for prompting at least one of the switching contacts to open on the basis of the result of the evaluation.

A special feature of the circuit breaker of the type in question is that it has a device for applying a DC voltage to the Rogowski converter. The purpose of this is to check the Rogowski converter for wire breakage: if a wire in the coil is damaged, a voltage offset is obtained at the output, said voltage offset being detected by the data processing device. This allows the data processing device to establish whether or not the Rogowski converter is functional.

It is now desirable to use one and the same type of electronic trip unit (ETU) for a multiplicity of switch rated currents. Depending on the rated trip current level, the amplifier stage of the ETU needs to amplify the output signals differently.

There is now the problem that when the Rogowski converter has a DC voltage applied to it, the offset is amplified differently depending on the gain factor in the amplifier stage. Since the data processing device has only a restricted input range for the measured values, this results in restrictions in the use of the ETU of the circuit breaker of the same type for different switch rated currents—the measurement range of the data processing device is not sufficiently large.

SUMMARY

An embodiment of the present invention is directed to a circuit breaker wherein the electronic trip unit used can be employed universally, i.e. can be applied over a very wide range of switch rated currents, without needing to have its design customized on a respectively individual basis.

One aspect of an embodiment is directed to a circuit breaker. One aspect of an embodiment also covers the provision of a method for checking a Rogowski converter in a circuit breaker.

In the case of the circuit breaker according to an embodiment of the invention, the device for applying a DC voltage to the Rogowski converter therefore comprises a digital/analog converter which is coupled to a communication bus which can be used to digitally prescribe the value for the DC voltage for the purpose of the conversion by the digital/analog converter.

The method according to an embodiment of the invention involves a data processing device being supplied with a piece of information regarding a switch rated current for the circuit breaker. The data processing device possibly prompts the setting of a switch-rated-current-dependent gain factor for an amplifier stage. Above all, however, it digitally prescribes the value for the voltage that is to be applied on the basis of the switch rated current, and this digitally prescribed value is converted by a digital/analog converter, as a result of which the voltage to be applied is output by the digital/analog converter.

BRIEF DESCRIPTION OF THE DRAWINGS

An example embodiment of the circuit breaker according to the invention is described in more detail below with reference to the drawing, in which.

DETAILED DESCRIPTION OF THE EXAMPLE EMBODIMENTS

Figure 1:
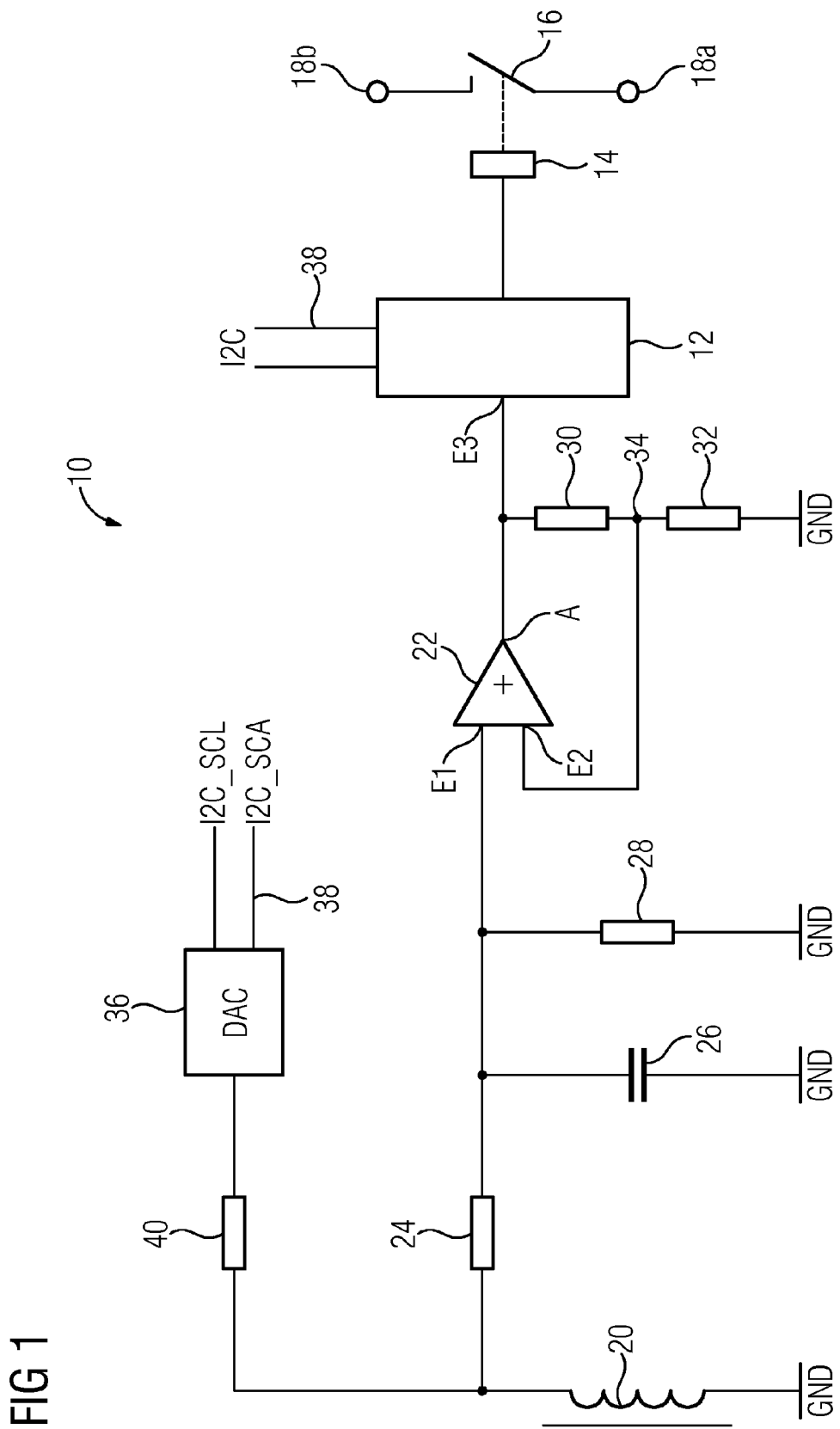
FIG. 1 illustrates a schematic circuit for those parts of the circuit breaker according to one embodiment of the invention which are essential to comprehension of the invention.
Figure 2:
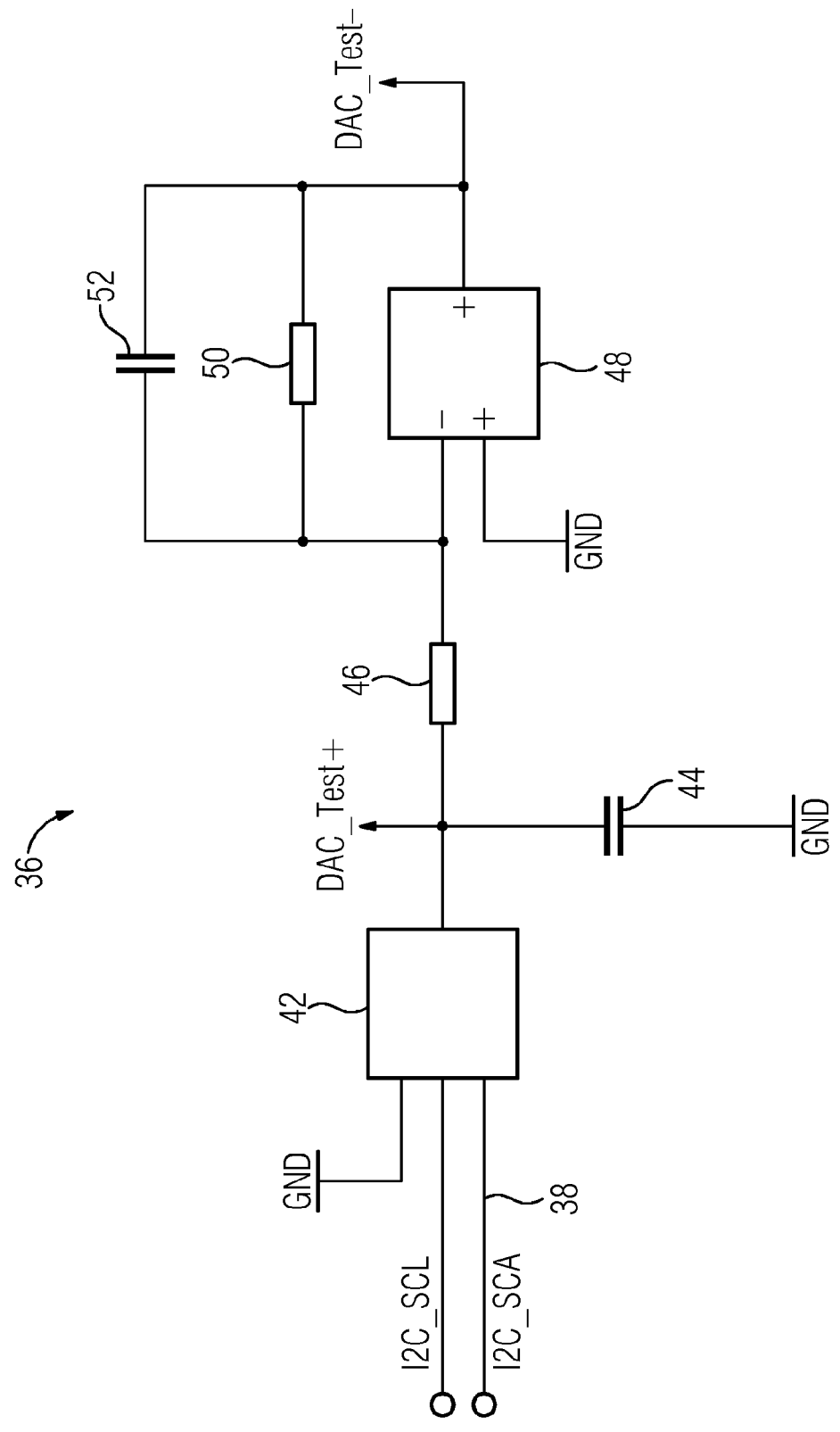
FIG. 2 illustrates the essential parts of a device for applying a DC voltage to the Rogowski converter, such as the circuit breaker according to an embodiment of the invention may have.

The present invention will be further described in detail in conjunction with the accompanying drawings and embodiments. It should be understood that the particular embodiments described herein are only used to illustrate the present invention but not to limit the present invention.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

Specific structural and functional details disclosed herein are merely representative for purposes of describing example embodiments of the present invention. This invention may, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

In the case of the circuit breaker according to an embodiment of the invention, the device for applying a DC voltage to the Rogowski converter therefore comprises a digital/analog converter which is coupled to a communication bus which can be used to digitally prescribe the value for the DC voltage for the purpose of the conversion by the digital/analog converter.

The use of a digital/analog converter allows the provision of a suitable data processing device as part of the device for applying a DC voltage to the Rogowski converter, which data processing device takes the switch rated current for which the circuit breaker is supposed to be designed as a basis for varying the DC voltage such that the offset produced is the same or of the same order of magnitude for all gain factors, which are usually likewise set on the basis of the switch rated current.

A digital/analog converter can also readily be provided on a printed circuit board in the circuit breaker, and therefore takes up little space.

In an example embodiment of the invention, the communication bus is also coupled to the data processing device for evaluating the amplified output signals and for prompting one of the switching contacts to open, and this data processing device is for its part also designed to stipulate both a gain factor for the amplifier stage and the amplitude of the DC voltage. This means that in some aspects the data processing device becomes part of the amplifier stage and part of the device for applying a DC voltage to the Rogowski converter. This proportional association can be linked to software modules, since the relevant design of the data processing device is usually made possible by virtue of the data processing device having being programmed as appropriate, i.e. software modules being executed on it. The data processing device could also be a PC system in production. This has the advantage that the microcontroller need not concern itself with the relevant communication with the digital/analog converter (digital potentiometer). The DAC is programmed or set during production.

The method according to an embodiment of the invention involves a data processing device being supplied with a piece of information regarding a switch rated current for the circuit breaker. The data processing device possibly prompts the setting of a switch-rated-current-dependent gain factor for an amplifier stage. Above all, however, it digitally prescribes the value for the voltage that is to be applied on the basis of the switch rated current, and this digitally prescribed value is converted by a digital/analog converter, as a result of which the voltage to be applied is output by the digital/analog converter.

The method involves the customization of the ETU of a particular type of circuit breaker to a particular switch rated current. The only operator control action which needs to be performed for this is routing the information regarding the switch rated current to the data processing device, i.e. programming the data processing device, which simply is usually a microcontroller. The programming can be effected in a very simple manner by specifying individual values when the software of the data processing device is of appropriate design. Equally, the information regarding the rated current, that is to say the relevant setting values, can also be written directly to the DAC (digital potentiometer) and stored if appropriate.

All further steps are performed by the data processing device itself. In this respect, once a piece of information regarding a switch rated current has been supplied, the check is usually performed automatically or following a user input by the circuit breaker itself. The data processing device or the microcontroller simply outputs the value for the voltage that is to be applied in digital form and detects the response of the Rogowski converter, i.e. checks whether there is a particular offset which indicates a wire breakage.

A circuit breaker denoted as a whole by 10 has a microcontroller 12 which is designed to actuate a mechanical trip unit 14, which for its part acts on a switching contact 16. The switching contact 16 can be used to interrupt a conductive connection between two connections 18a and 18b of the circuit breaker 10.

Usually, the current level of the current flowing through the line is measured, in the present case using a Rogowski converter 20, which is shown without the line in FIG. 1. The Rogowski converter 20, also called a Rogowski coil, comprises an air-core inductor, that is to say a coil which is wound on a plastic core (or on no core at all). A change in the current level prompts the induction of a voltage in the Rogowski converter 20, and the extent of this induced voltage is detected by the microcontroller 12. If the result of an evaluation by the microcontroller 12 is that the current level is too high, the trip unit 14 is actuated so that the switching contact 16 is opened.

The aim is now for one and the same circuit breaker 10 to be suitable for different rated currents. However, the microcontroller 12 has only a limited measurement range as far as the possible input values are concerned. For this reason, the circuit breaker 10 comprises an amplification stage 22 with an operational amplifier which is coupled via a resistor 24 to the Rogowski coil 20, the other end of which is coupled to ground ("GND"). Furthermore, the input E1 of the amplifier 22 is likewise coupled to ground via a parallel circuit comprising a capacitor 26 and a resistor 28.

The output A of the amplifier 22 is likewise coupled to ground via a voltage divider having the resistors 30 and 32, with a central voltage tap 34 between the resistors 30 and 32 being coupled to the second input E2 of the amplifier 22.

Furthermore, the output of the amplifier 22 is coupled to the input E3 of the microcontroller 12.

If it knows the rated current, the microcontroller 12 can actuate the amplifier 22—in a manner which is not shown— such that a suitable gain factor is provided for signals corresponding to the rated current to be in the order of magnitude of the possible input values for the microcontroller 12. Alternatively, the gain factor (customization of the ETU to the rated current of the switch) is written to a digital potentiometer in production by means of I2C communication, said potentiometer setting the gain factor. The digital potentiometer corresponds to the resistor 32 in FIG. 1.

The aim is now for the Rogowski converter 20 to be checked for a possible wire breakage, that is to say damage to the winding. To this end, a DC voltage is applied to the Rogowski converter 20, and an offset resulting via the amplifier stage 22 is detected by the ADC of the microcontroller 12 in the event of a wire breakage. This offset is produced in the following manner: if there is no wire breakage, the offset or the offset voltage is very low, since the internal resistance of the coil is very low (e.g. approximately 200 ohms). This offset voltage is obtained from the flow of current via the resistor 40 and the resulting voltage drop across the internal resistance of the Rogowski coil 20.

If there is a wire breakage, the internal resistance of the Rogowski coil 20 is very high (theoretically infinite). Hence, the internal resistance of the faulty Rogowski coil is many times greater than the series resistor 40. Therefore, almost the entire output voltage of the DAC 36 drops across the internal resistance of the coil. The offset voltage is accordingly high. A downstream amplifier stage is therefore driven almost at the full level and signals to the microcontroller 12 an overload situation/short circuit situation, for example. Hence, the circuit breaker is tripped when there is a faulty current transformer (Rogowski coil).

In the present case, the DC voltage is prescribed by virtue of a digital/analog converter 36 receiving a digital input signal, specifically via a communication bus 38 (the I2C bus), and converting this input signal directly into an analog voltage which is supplied to the Rogowski converter 20 via the resistor 40. In the present case, provision is intended to be made particularly for the microcontroller 12 to have appropriate outputs for the communication bus I2C in order to supply the relevant signals to the digital/analog converter 36.

This means that the value of the DC voltage which the digital/analog converter 36 outputs may be selected to suit the gain of the amplifier 22, as a result of which the microprocessor 12 can use the input signals to distinguish precisely whether there is an offset to a particular extent which indicates a wire breakage on the Rogowski converter 20, or whether this is not the case.

The test circuit for the Rogowski coils 36 may be of somewhat more complex design, namely may have a digital/analog converter stage 42 which directly, in a manner delimited from ground by a capacitor 44, outputs a positive test signal DAC_Test+, that is to say a positive DC voltage, and which optionally converts this positive test signal DAC_Test+ by way of a resistor 46 and an operational amplifier 48 (specifically the inverting input thereof), which is fed back via a resistor 50 and a capacitor 52, into a negative test voltage DAC_Test– which has the same value but with the inverse arithmetic sign. Hence, a differential version of the analog input circuit (20, 24, 26, 28) can likewise be checked for wire breakage.

The reason is that the use of both a positive and a negative DC voltage is advantageous for more complex measurements (e.g. differential measurement) of wire breakage. At the same time, the Rogowski converter 20 is supplied with the positive DC voltage DAC_Test+ and the negative DC voltage DAC_Test–.

The example embodiment or each example embodiment should not be understood as a restriction of the invention. Rather, numerous variations and modifications are possible in the context of the present disclosure, in particular those variants and combinations which can be inferred by the person skilled in the art with regard to achieving the object for example by combination or modification of individual features or elements or method steps that are described in connection with the general or specific part of the description and are contained in the claims and/or the drawings, and, by way of combinable features, lead to a new subject matter or to new method steps or sequences of method steps, including insofar as they concern production, testing and operating methods.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims.

Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

Further, elements and/or features of different example embodiments may be combined with each other and/or substituted for each other within the scope of this disclosure and appended claims.

Still further, any one of the above-described and other example features of the present invention may be embodied in the form of an apparatus, method, system, computer program, tangible computer readable medium and tangible computer program product. For example, of the aforementioned methods may be embodied in the form of a system or device, including, but not limited to, any of the structure for performing the methodology illustrated in the drawings.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A circuit breaker, comprising:
    at least one switching contact including a Rogowski converter;
    an amplifier stage configured to amplify output signals from the Rogowski converter;
    a data processing device configured to evaluate the amplified output signals and configured to prompt at least one of the at least one switching contact to open based upon a result of the evaluation; and
    a device configured to apply a DC voltage to the Rogowski converter, the device including a digital/analog converter and being operatively coupled to a communication bus, the device further being configured to digitally prescribe a value for the DC voltage for conversion by the digital/analog converter.

2. The circuit breaker of claim 1, wherein the communication bus is also operatively coupled to the data processing device and wherein the data processing device is configured to stipulate both a gain factor for the amplifier stage and the value for the DC voltage.

3. A method for checking a Rogowski converter in a circuit breaker, in which a voltage is applied to the Rogowski converter, the method comprising:
    supplying a data processing device with information regarding a switch rated current for the circuit breaker;
    digitally prescribing the data processing device with a value, for a DC voltage, based on the switch rated current; and
    converting the digitally prescribed value, via a digital/analog converter; and
    outputting, from the digital/analog converter, the voltage to be applied to the Rogowski converter.

4. The method of claim 3, wherein a communication bus is operatively coupled to the data processing device and wherein the data processing device is configured to stipulate both a gain factor for the amplifier stage and the value for the DC voltage.

5. The method of claim 3, further comprising:
    applying the voltage to the Rogowski converter.

* * * * *